(12) United States Patent
Bae et al.

(10) Patent No.: US 7,885,104 B2
(45) Date of Patent: Feb. 8, 2011

(54) INFORMATION STORAGE DEVICES USING MAGNETIC DOMAIN WALL MOVEMENT AND METHODS OF OPERATING THE SAME

(75) Inventors: Ji-young Bae, Busan (KR); Kwang-seok Kim, Seongnam-si (KR); Mathias Kläui, Constance (DE)

(73) Assignee: Samsung Electronics Co., Ltd., Gyeonggi-do (KR)

(*) Notice: Subject to any disclaimer, the term of this patent is extended or adjusted under 35 U.S.C. 154(b) by 289 days.

(21) Appl. No.: 12/155,798

(22) Filed: Jun. 10, 2008

(65) Prior Publication Data
US 2009/0180218 A1    Jul. 16, 2009

(30) Foreign Application Priority Data
Jan. 14, 2008    (KR) .................... 10-2008-0003933

(51) Int. Cl.
*G11C 11/14*    (2006.01)
(52) U.S. Cl. .................. 365/171; 365/173; 365/158
(58) Field of Classification Search ................ 365/171, 365/173, 81, 158
See application file for complete search history.

(56) References Cited

U.S. PATENT DOCUMENTS

2008/0152953 A1* 6/2008 Lim ..................... 428/827

* cited by examiner

*Primary Examiner*—Huan Hoang
(74) *Attorney, Agent, or Firm*—Harness, Dickey & Pierce

(57) ABSTRACT

An information storage device includes a magnetic layer configured to store information, a first and second conductive layer. The first conductive layer contacts a first end of the magnetic layer. The second conductive layer contacts a second end of the magnetic layer. The magnetic layer includes first and second pinning regions at which magnetic domain walls are pinned. The widths of the magnetic layer at the first and second pinning regions are different.

20 Claims, 12 Drawing Sheets

INFORMATION STORAGE DEVICES USING MAGNETIC DOMAIN WALL MOVEMENT AND METHODS OF OPERATING THE SAME

PRIORITY STATEMENT

This application claims priority under 35 U.S.C. §119 to Korean Patent Application No. 10-2008-0003933, filed on Jan. 14, 2008, in the Korean Intellectual Property Office, the entire contents of which is incorporated herein by reference.

BACKGROUND

Description of the Related Art

Conventional non-volatile information storage devices such as a hard disk drive (HDD) or a nonvolatile random access memory (RAM) retain recorded information even when power is cut off.

A conventional HDD stores recorded information using a rotating part. But, the rotating part may wear down over time, which may increase the chances of operational failure. The increased chance of operational failure reduces reliability of this type of information storage device.

An example of a conventional non-volatile RAM is a flash memory. Unlike a conventional HDD, a conventional flash memory does not utilize a rotating part. However, conventional flash memories have relatively slow reading and writing speeds, relatively short life spans, and relatively small storage capacities when compared to conventional HDDs. Flash memories may also have relatively high manufacturing costs.

Another type of conventional nonvolatile information storage device uses principles of magnetic domain wall movement of a magnetic material. In these conventional information storage devices, a minute magnetic region—a ferromagnetic substance—is referred to as a magnetic domain, and a boundary portion between magnetic domains is referred to as a magnetic domain wall. The magnetic domain walls have different magnetization directions relative to the magnetic domains. A magnetic domain wall may have a given volume and may be moved by applying a current or an external magnetic field to a magnetic layer.

Conventional information storage devices using magnetic domain wall movement are single bit storage devices capable of writing only one bit data (e.g., "0" or "1") in a single memory cell. As a result, increasing the degree of integration and capacity of the information storage device is limited.

SUMMARY

Example embodiments relate to information storage devices and methods of operating the same, for example, an information storage device using magnetic domain wall movement and a method of operating the same.

Example embodiments provide information storage devices using principles of magnetic domain wall movement in which multi-bit (e.g., 2-bit or greater) information may be written in one memory cell, and a method of operating the same.

At least one example embodiment provides an information storage device. The information storage device may include a magnetic layer for storing information. A first conductive layer may contact a first end of the magnetic layer, and a second conductive layer may contact a second end of the magnetic layer. The magnetic layer may include first and second pinning regions at which a magnetic domain walls may be pinned. Widths of the magnetic layer at the first and second pinning regions may be different.

According to at least some example embodiments, the first end of the magnetic layer, the first pinning region, the second pinning region, and the second end of the magnetic layer may be arranged sequentially. The width of the magnetic layer may be tapered from a first end of the magnetic layer to the first pinning region. The width of the magnetic layer may increase from the first pinning region to the second pinning region. The width of the magnetic layer may taper from the second pinning region to the second end of the magnetic layer. The magnetic layer may have horizontal magnetic anisotropy.

According to at least some example embodiments, types of magnetic domain walls pinned at the first and second pinning regions may be different. Resistance states of the magnetic layer may be different depending on whether magnetic domain walls exist in the first and second pinning regions. At least one of the first and second conductive layers may cross the magnetic layer. At least one of the first and second conductive layers may be perpendicular or substantially perpendicular to the magnetic layer.

According to at least some example embodiments, the first end of the magnetic layer, the first pinning region, the second pinning region, and the second end of the magnetic layer may be arranged such that a line connecting a center of each of the first end of the magnetic layer, the first pinning region, the second pinning region, and the second end of the magnetic layer may be a straight line or a curve.

At least one other example embodiment provides a method of operating an information storage device. The information storage device may include a magnetic layer for storing information, a first conductive layer contacting a first end of the magnetic layer, and a second conductive layer contacting a second end of the magnetic layer. The magnetic layer may include first and second pinning regions at which magnetic domain walls may be pinned. Widths of the magnetic layer at the first and second pinning regions may be different. According to at least this example embodiment, a current may be applied to at least one of the first conductive layer, the second conductive layer and the magnetic layer.

According to at least some example embodiments, the current may be one of a write current, a read current, and an erase current. The first end of the magnetic layer, the first pinning region, the second pinning region, and the second end of the magnetic layer may be arranged sequentially. The width of the magnetic layer may be tapered from the first end of the magnetic layer to the first pinning region. The width of the magnetic layer may increase from the first pinning region to the second pinning region. The width of the magnetic layer may be tapered from the second pinning region to the second end of the magnetic layer.

According to at least some example embodiments, a first current may be applied to the first conductive layer so that the first end of the magnetic layer is magnetized in a direction opposite to a first magnetization direction of the magnetic layer. The first magnetization direction may be parallel to the lengthwise direction of the magnetic layer. A first magnetic domain wall of a first type generated between the first end of the magnetic layer and another region thereof may move to the first pinning region and may be pinned at the first pinning region.

Before applying the first current to the first conductive layer, an initialization current may be applied to the magnetic layer so that the magnetic layer may be magnetized in the first magnetization direction.

According to at least some example embodiments, after the applying of the first current to the first conductive layer, a second current may be applied to the magnetic layer so that the first magnetic domain wall may be changed to a second type and may move to the second pinning region. An intensity of the second current may be smaller than an intensity of the first current. After applying the second current to the magnetic layer, a third current may be applied to the first conductive layer so that the first end of the magnetic layer may be magnetized in the first magnetization direction. A second magnetic domain wall of a first type may be generated between the first end of the magnetic layer and another region thereof may be moved to the first pinning region and may be pinned at the first pinning region.

According to at least some example embodiments, after applying the first current to the first conductive layer, an initialization current may be applied to the magnetic layer so that the magnetic layer may be magnetized in the first magnetization direction. After applying the second current to the magnetic layer, another current may be applied to the magnetic layer so that the first magnetic domain wall positioned at the second pinning region may change to the first type and may move to the first pinning region. After applying the second current to the magnetic layer, an initialization current may be applied to the magnetic layer so that the magnetic layer may be magnetized in the first magnetization direction. After applying the third current to the first conductive layer, an initialization current may be applied to the magnetic layer so that the magnetic layer may be magnetized in the first magnetization direction.

BRIEF DESCRIPTION OF THE DRAWINGS

Example embodiments will become more apparent by describing in detail with reference to the attached drawings in which.

DETAILED DESCRIPTION OF EXAMPLE EMBODIMENTS

Figure 1:
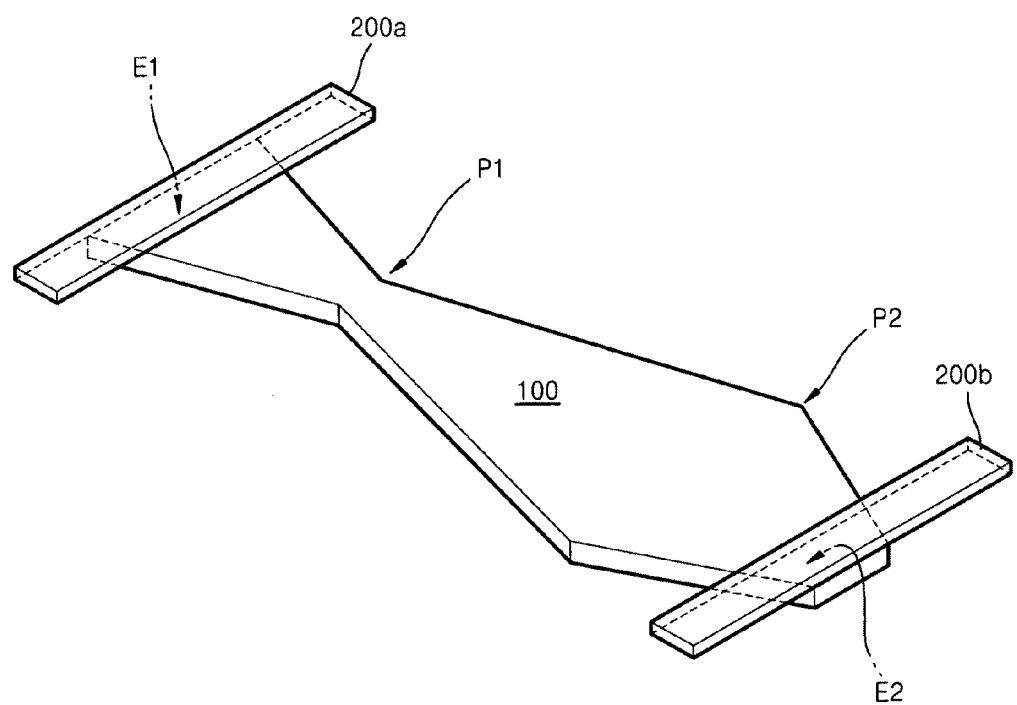
FIG. 1 is a perspective view of an information storage device using magnetic domain wall movement according to an example embodiment.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 illustrates an information storage device using magnetic domain wall movement according to an example embodiment.

Referring to FIG. 1, a magnetic layer 100 for storing information (e.g., multi-bit data) may extend in a given direction. The magnetic layer 100 may have horizontal magnetic anisotropy and may be a soft magnetic layer formed of at least one of Co, Ni, an alloy thereof or the like. The magnetic layer 100 may have first and second pinning sites P1 and P2. Although discussed herein as pinning sites, the pinning sites may also be referred to as pinning regions. The first and second pinning sites P1 and P2 may be sequentially arranged between a first end E1 and a second, opposite end E2. A line connecting a center of each of the first end E1, the first pining site P1, the second pinning site P2, and the second end E2 of the magnetic layer 100 may be a straight line. Alternatively the line may be curved. The first and second pinning sites P1 and P2 may be sites at which a magnetic domain wall is pinned. The pinning sites P1 and P2 may have different widths.

Still referring to FIG. 1, the width of the magnetic layer 100 may be tapered from the first end E1 to the first pinning site P1, the width of the magnetic layer 100 may increase from the first pinning site P1 to the second pinning site P2, and the width of the magnetic layer 100 may be tapered from the second pinning site P2 to the second end E2.

A first conductive layer 200a may contact the first end E1 of the magnetic layer 100. A second conductive layer 200b may contact the second end E2 of the magnetic layer 100. At least one of the first and second conductive layers 200a and 200b may cross (e.g., perpendicularly cross) the magnetic layer 100. In addition, at least one of the first and second conductive layers 200a and 200b may have a wire shape extending to both sides of the magnetic layer 100. A current or magnetic field may be applied to the magnetic layer 100 through the first and second conductive layers 200a and 200b.

Because the widths of the first and second pinning sites P1 and P2 are different from each other, types of magnetic domain walls capable of being pinned at the first and second pinning sites P1 and P2 may be different from each other. For example, because the energy of a transverse type magnetic domain wall (hereinafter, referred to as a transverse wall) is relatively stable in a place where the width of the magnetic layer 100 is relatively narrow, the transverse wall may be pinned at the first pinning site P1. On the other hand, because the energy of a vortex type magnetic domain wall (hereinafter, referred to as a vortex wall) is relatively stable in a place where the width of the magnetic layer 100 is relatively wide, the vortex wall may be pinned at the second pinning site P2. This will be described in greater detail with reference to FIGS. 2A and 2B.

Figure 2A:
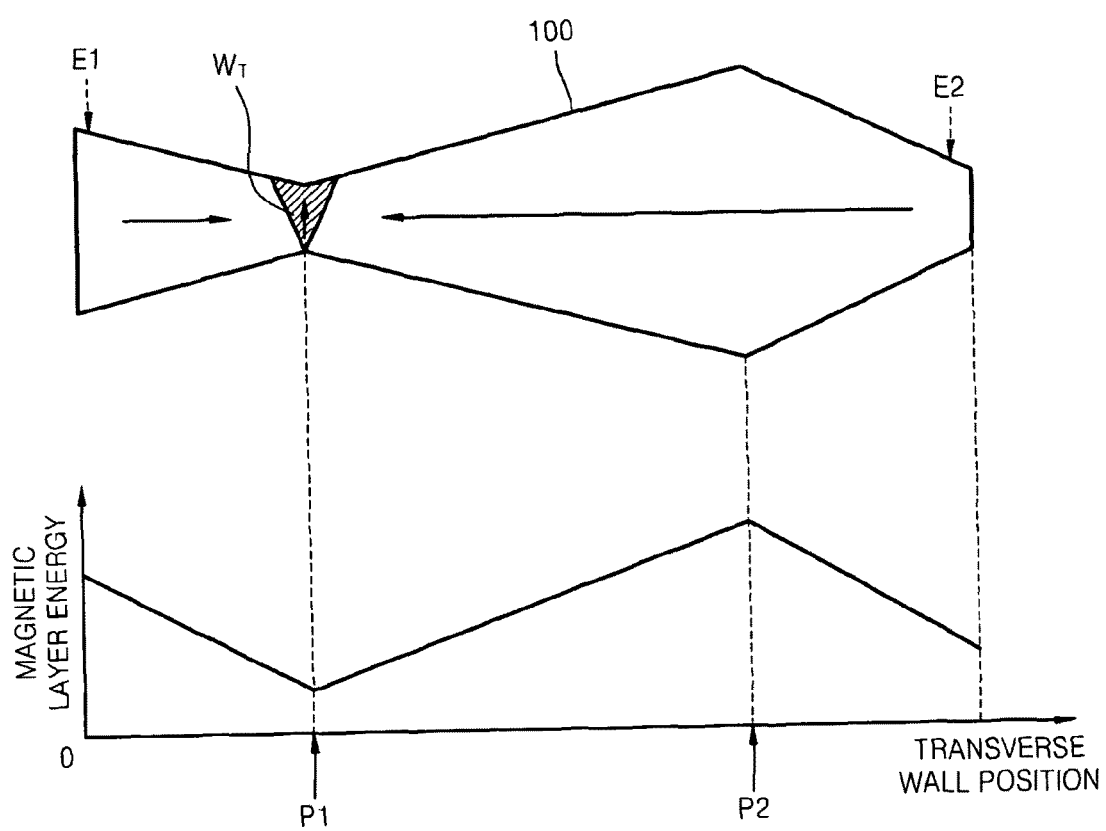
FIG. 2A illustrates a magnetic layer having a transverse wall and a change in energies of the magnetic layer according to the position of the transverse wall according to an example embodiment.

FIG. 2A illustrates a magnetic layer having a transverse wall according to an example embodiment.

As illustrated in FIG. 2A, as a transverse wall $W_T$ moves closer to the first pinning site P1, the energy of the magnetic layer 100 decreases. As the transverse wall $W_T$ moves closer to the second pinning site P2, the energy of the magnetic layer 100 increases. Thus, if the transverse wall $W_T$ is generated near the first end E1 of the magnetic layer 100, the transverse wall $W_T$ may spontaneously move to the first pinning site P1 and stop there.

Figure 2B:
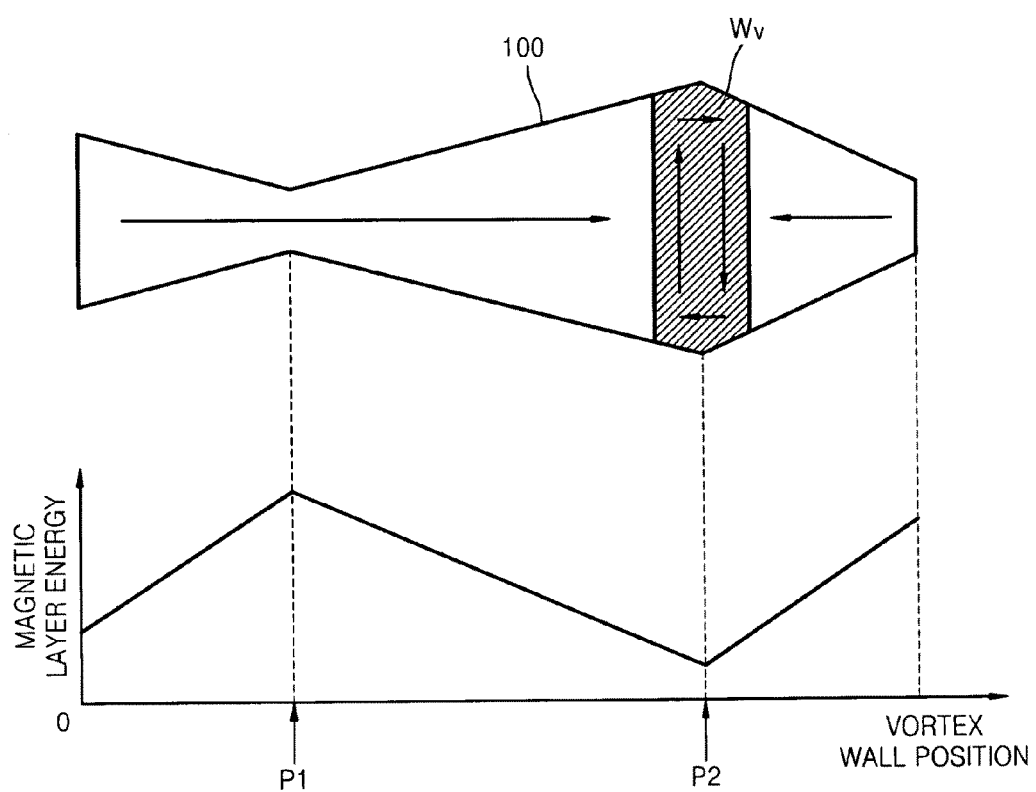
FIG. 2B illustrates a magnetic layer having a vortex wall and a change in energies of the magnetic layer according to the position of the vortex wall according to an example embodiment.

FIG. 2B illustrates a magnetic layer having a vortex wall according to an example embodiment.

As illustrated in FIG. 2B, as a vortex wall $W_V$ moves closer to the first pinning site P1, the energy of the magnetic layer 100 increases. As the vortex wall $W_V$ moves closer to the second pinning site P2, the energy of the magnetic layer 100 decreases. Thus, if the vortex wall $W_V$ is positioned at the first pinning site P1, the vortex wall $W_V$ may spontaneously move to the second pinning site P2 and stop there.

Arrows within the magnetic layer 100 illustrated in FIGS. 2A and 2B represent the magnetization direction of a corresponding region. Regions of the magnetic layer 100 at each side of the transverse wall $W_T$ of FIG. 2A and each side of the vortex wall $W_V$ of FIG. 2B may be magnetized in different directions.

Figure 3:
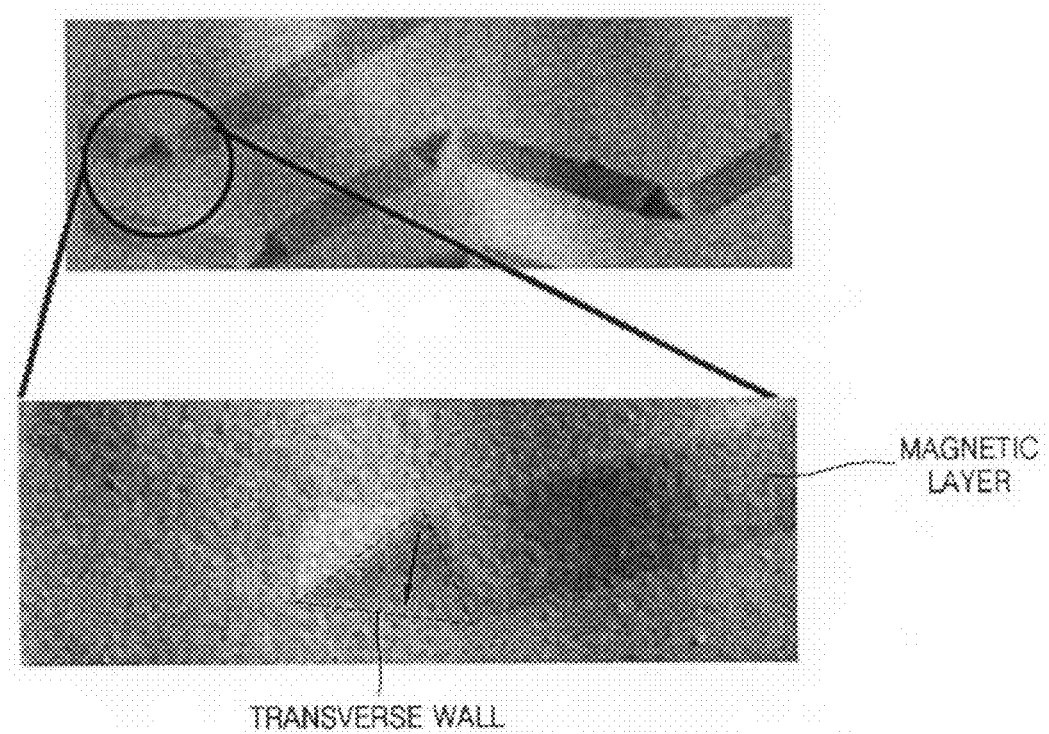
FIGS. 3 and 4 are photoelectron emission microscope (PEEM) photographic images showing magnetic layers each having a transverse wall and a vortex wall.
Figure 4:
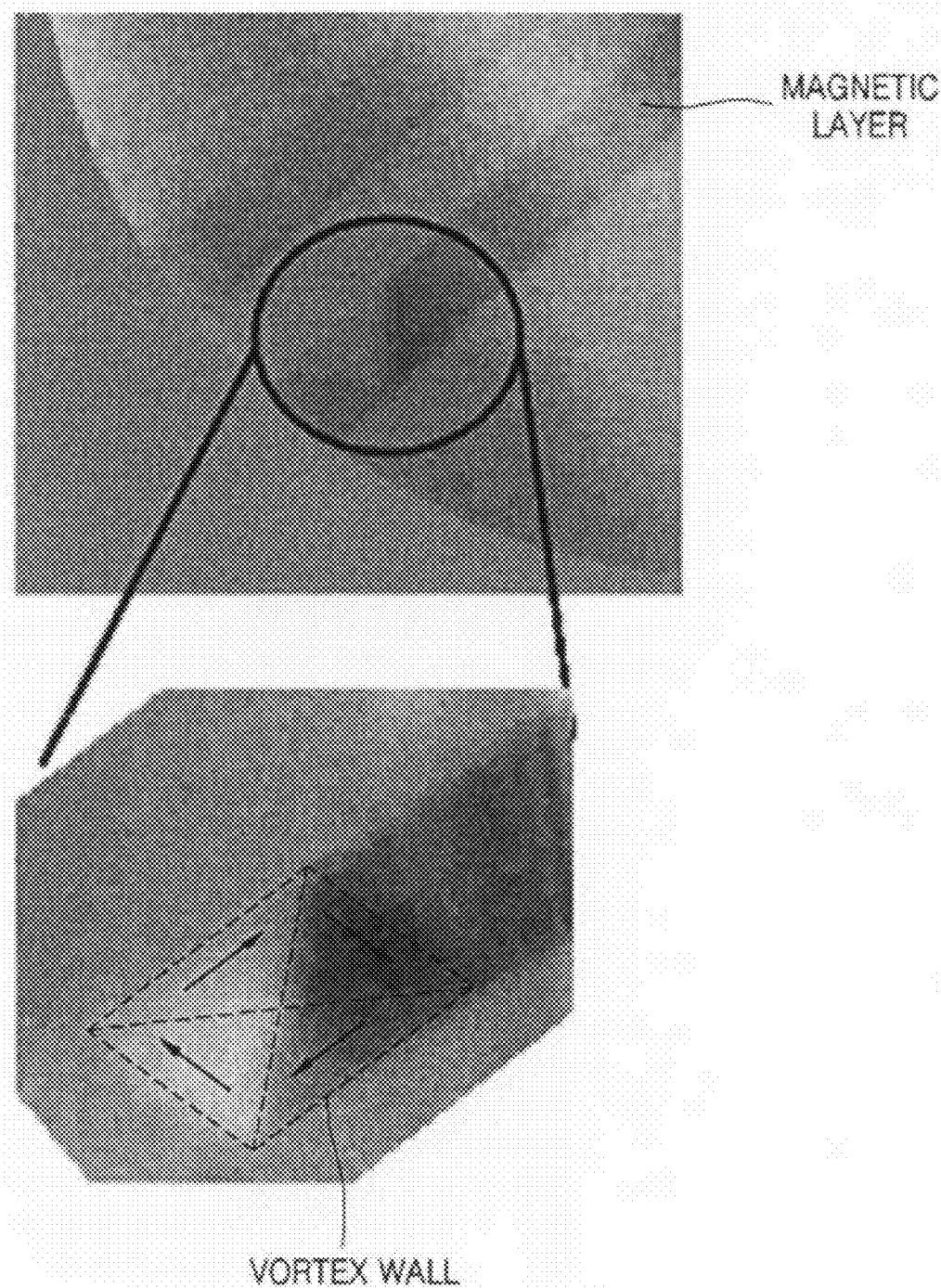

FIGS. 3 and 4 are photoelectron emission microscope (PEEM) photographic images showing magnetic layers each having a transverse wall and a vortex wall according to example embodiments.

In this example, a relatively short pulse current of about $10^{12}$ A/m$^2$ is applied to the magnetic layer of FIG. 3 so that the transverse wall of FIG. 3 converts to the vortex wall of FIG. 4. Alternatively, the vortex wall of FIG. 4 may be converted to a transverse wall.

FIGS. 5A through 5D are plan views showing four different states of a magnetic layer according to example embodiments.

Figure 5A:
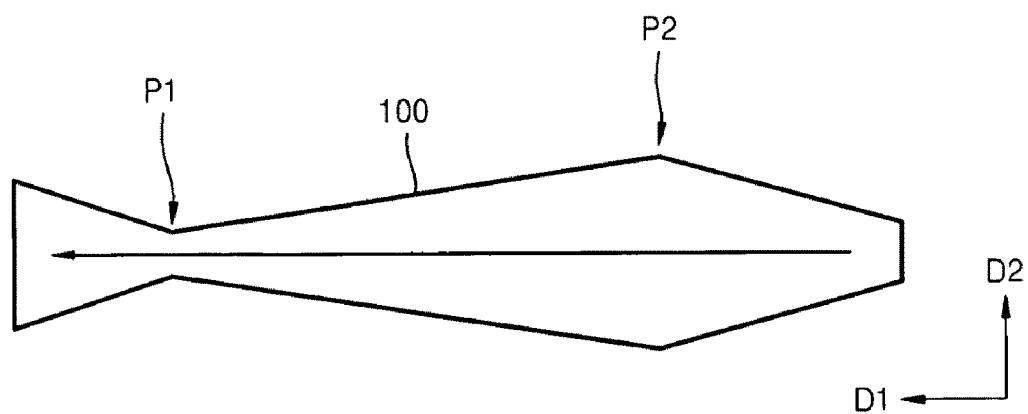
FIGS. 5A through 5D are plan views showing four different states of a magnetic layer according to example embodiments.

Referring to FIG. 5A, the magnetic layer 100 may be magnetized in a first direction D1 parallel to the lengthwise direction of the magnetic layer 100 so that a magnetic domain wall in the magnetic layer 100 is suppressed and/or does not exist. Alternatively, the magnetic layer 100 may be magnetized in a direction opposite to the first direction D1.

Figure 5B:
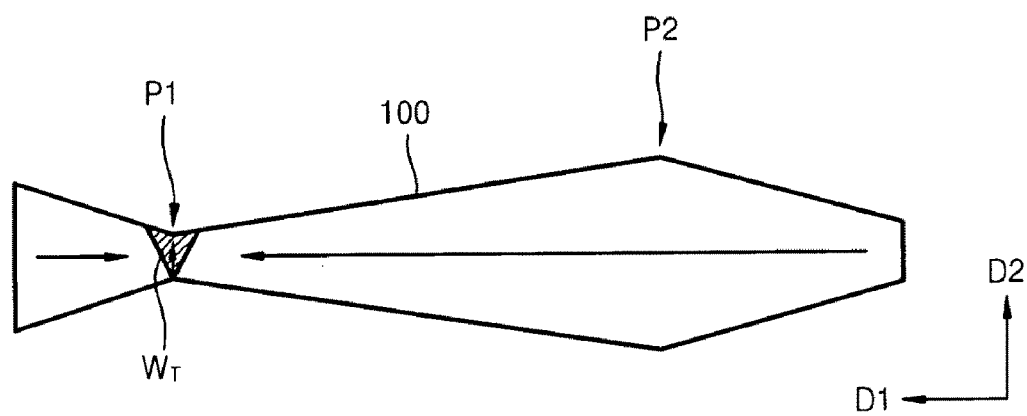

Referring to FIG. 5B, a transverse wall $W_T$ may be positioned at the first pinning site P1 of the magnetic layer 100. The transverse wall $W_T$ may be magnetized in a second direction D2. The second direction D2 may be perpendicular to the first direction D1. Regions of the magnetic layer 100 at each side of the transverse wall $W_T$ may be magnetized in opposite directions—as indicated by the arrows within the magnetic layer 100. The transverse wall $W_T$ may be magnetized in a direction opposite to the second direction D2 and the magnetization directions of the regions of the magnetic layer 100 at each side of the transverse wall $W_T$ may be changed.

Figure 5C:
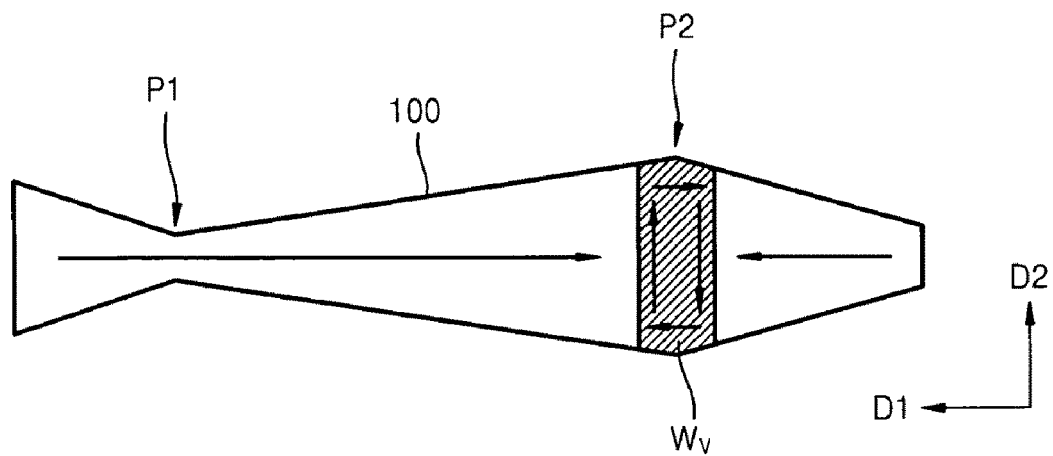

Referring to FIG. 5C, a vortex wall $W_V$ may be positioned at the second pinning site P2 of the magnetic layer 100. The vortex wall $W_V$ may have a clockwise magnetization direction, and regions of the magnetic layers 100 at each side of the vortex wall $W_V$ may be magnetized in opposite directions. Alternatively, the vortex wall $W_V$ may have a counter-clockwise magnetization direction, and the magnetization directions of the regions of the magnetic layers 100 at each side of the vortex wall $W_V$ may be opposite to the directions shown in FIG. 5C.

Figure 5D:
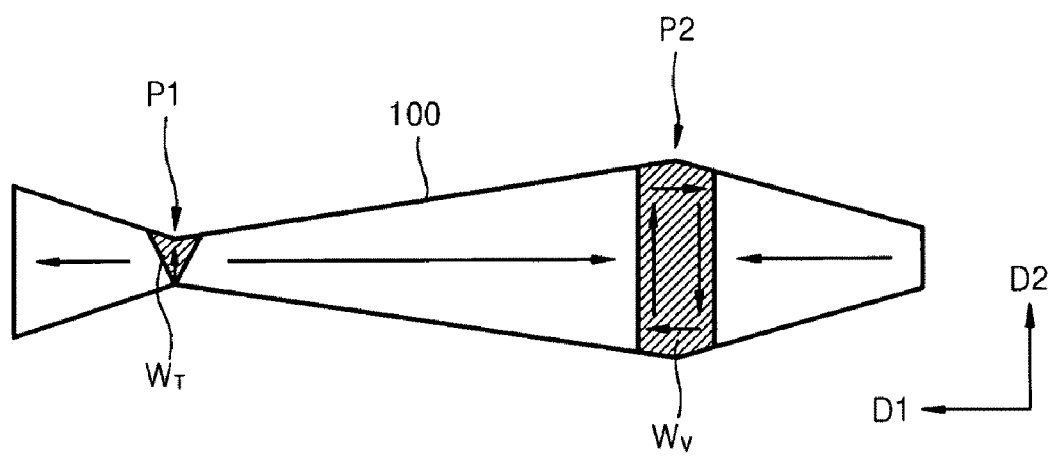

Referring to FIG. 5D, the transverse wall $W_T$ and the vortex wall $W_V$ may be positioned at the first and second pinning sites P1 and P2, respectively. The magnetization directions of the transverse wall $W_T$, the vortex wall $W_V$, and the regions of the magnetic layers 100 at each side of the transverse wall $W_T$ and the vortex wall $W_V$ may be changed.

The magnetic layer 100 shown in each of FIGS. 5A through 5D may have different electrical resistances. For example, the resistance state of the magnetic layer 100 may be changed depending on whether the transverse wall $W_T$ exists in the first pinning site P1 and whether the vortex wall $W_V$ exists in the second pinning site P2. If the electrical resistances of the magnetic layers 100 of FIGS. 5A through 5D are referred to as first through fourth resistances R1 through R4, the relationship between the first through fourth resistances R1 through R4 may be R1>R2>R3>R4.

In one example embodiment, if the magnetic layer 100 is an NiFe layer having the average width of about 500 nm, a thickness of about 20 nm, and a length of about 15 μm, the second resistance R2 may be smaller than the first resistance R1 by about 200 mΩ. The third resistance R3 may be smaller than the first resistance R1 by about 250 mΩ. The fourth resistance R4 may be smaller than the first resistance R1 by about 450 mΩ.

Because the magnetic layers 100 of FIGS. 5A through 5D have different electrical resistances, information written on the magnetic layers 100 of FIGS. 5A through 5D may correspond to "00", "01", "10", and "11", respectively. Accordingly, the information storage device according to at least this example embodiment may be used as a multi-bit storage device. Thus, a multi-bit information storage device having relatively large storage capacity and/or relatively high degree of integration may be realized.

FIGS. 6A through 6I are plan views illustrating a method of operating an information storage device using magnetic domain wall movement according to an example embodiment.

Figure 6A:
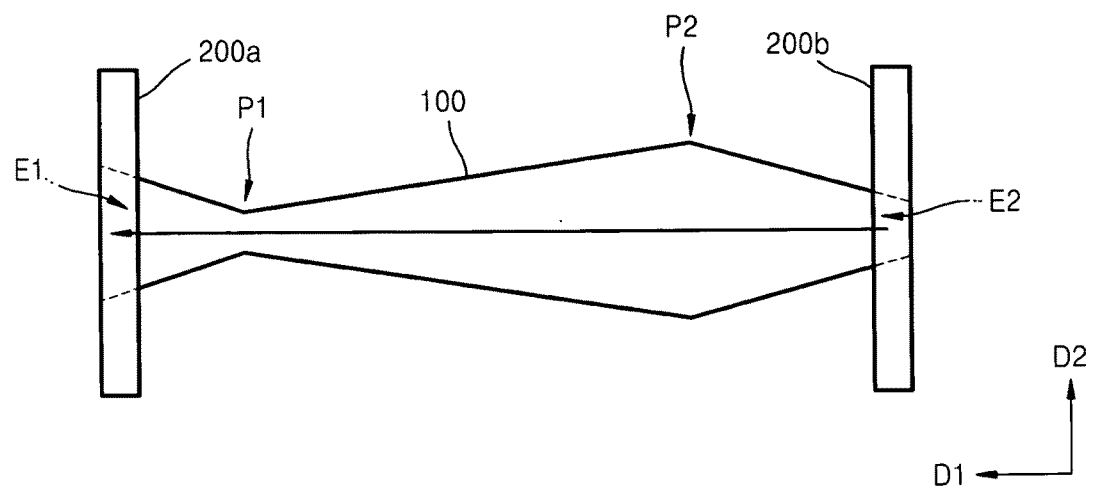
FIGS. 6A through 6I are plan views illustrating a method of operating an information storage device using magnetic domain wall movement according to example embodiments.

Referring to FIG. 6A, a magnetic layer 100 may be magnetized in a first direction D1. To magnetize the magnetic layer 100 in the first direction D1, a current (hereinafter, referred to as an initialization current) may be applied to the second conductive layer 200b from the first conductive layer 200a through the magnetic layer 100. Because the direction of the current and the direction of electrons are opposite, the electrons may move in the first direction D1 within the magnetic layer 100 according to the initialization current so that the magnetic layer 100 may be magnetized in the first direction D1. Other methods for magnetizing the magnetic layer 100 in the first direction D1 may also be used. For example, an external magnetic field may be applied to the magnetic layer 100 in a first direction D1 to magnetize the magnetic layer 100 in the first direction D1. The magnetic layer 100 of FIG. 6A corresponds to the magnetic layer 100 of FIG. 5A.

Figure 6B:
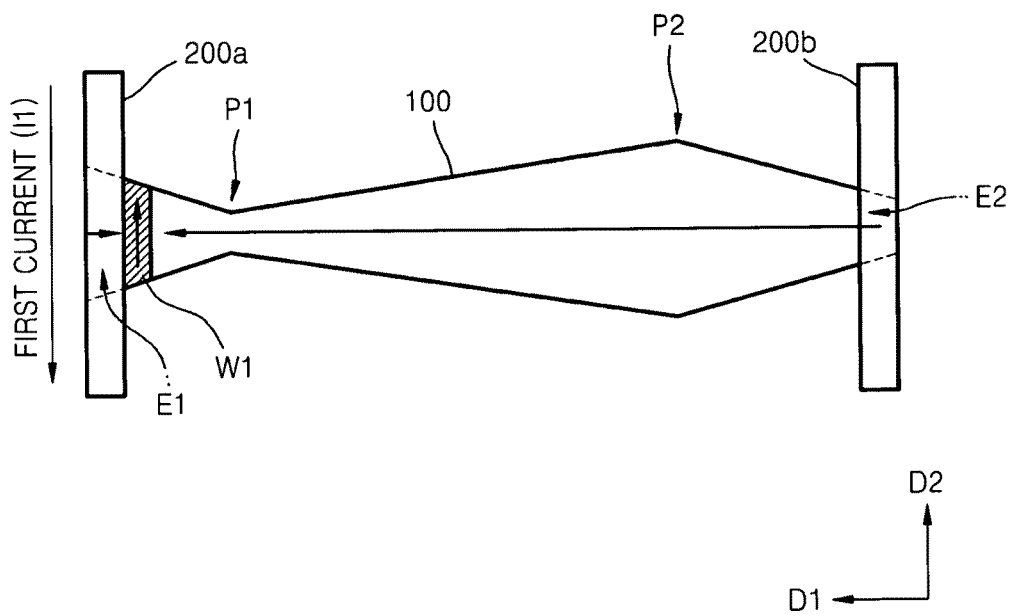

Referring to FIG. 6B, a first current I1 may be applied from one end of a first conductive layer 200a to the other end thereof. The flow of the first current I1 creates a magnetic field according to the right hand screw rule. The magnetic field surrounds the first conductive layer 200a and a portion of the magnetic layer 100 under the first conductive layer 200a, thereby magnetizing the portion of the magnetic layer 100 under the first conductive layer 200a (e.g., the first end E1 of the magnetic layer 100). The direction of the magnetization of the first end E1 may be opposite to the first direction D1. Thus, a transverse type first magnetic domain wall W1 may be generated between the first end E1 of the magnetic layer 100 and the other portion thereof. The first current I1 may be a current greater than or equal to a critical current used to magnetize the first end E1 of the magnetic layer 100. The critical current may be changed according to a material used in forming the magnetic layer 100.

Because the energy of the transverse wall W1 is relatively stable in a place where the width of the magnetic layer 100 is relatively narrow, the transverse wall W1 may spontaneously move to the first pinning site P1.

Figure 6C:
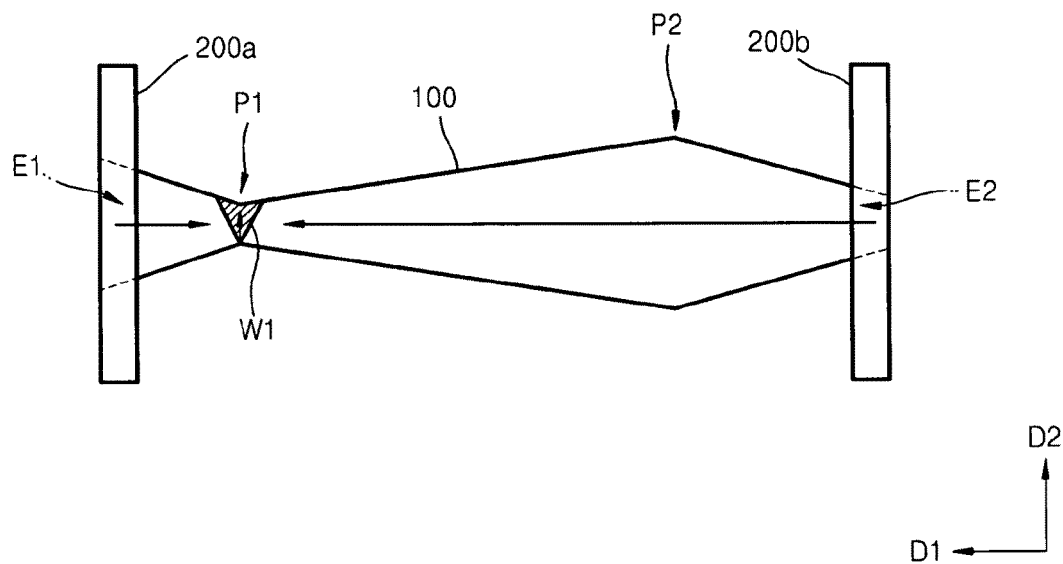

FIG. 6C illustrates a state in which the transverse type first magnetic domain wall W1 is moved to and pinned at the first pinning site P1. A magnetic layer 100 of FIG. 6C may correspond to the magnetic layer 100 of FIG. 5B.

Figure 6D:
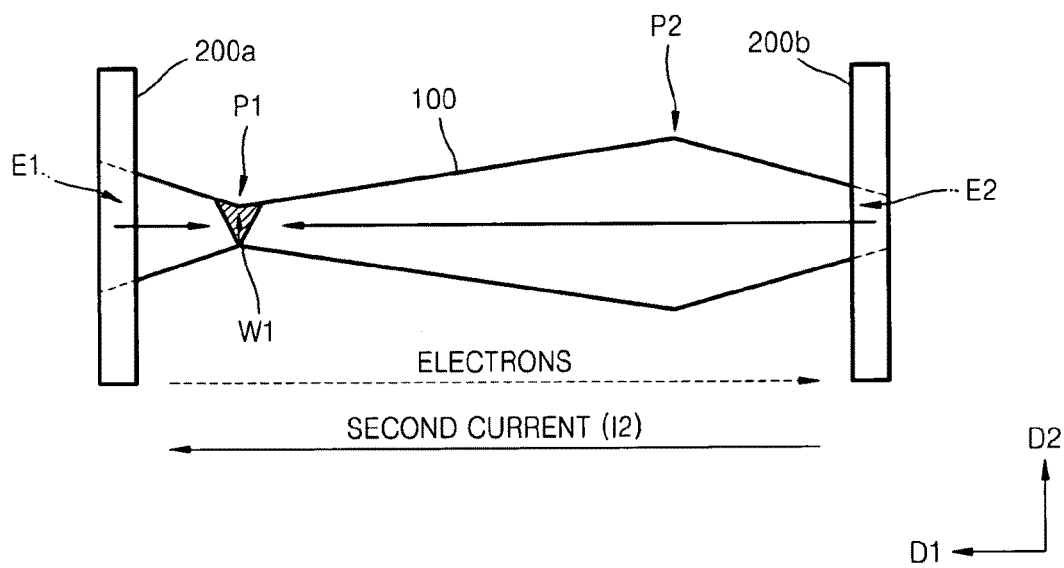

Referring to FIG. 6D, a second current I2 in a first direction D1 may be applied to the magnetic layer 100 through first and second conductive layers 200a and 200b. An application time of the second current I2 may be shorter or substantially shorter than an application time of the initialization current. While energy is applied to the transverse wall W1 by the second current I2 for a relatively short time, the transverse wall W1 may change to a vortex wall.

Figure 6E:
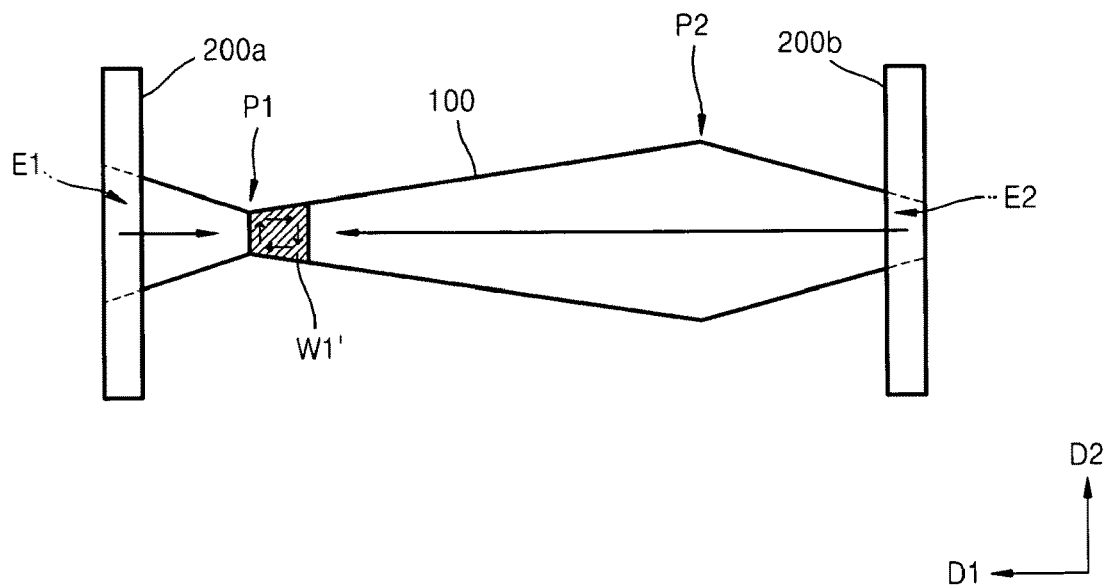

According to at least this example embodiment, the second current I2 may cause the transverse wall W1 to change to a vortex wall W1' as illustrated in FIG. 6E. As shown in FIG. 6E, the vortex wall W1' may escape (e.g., slightly escape) in a direction (e.g., a right direction) opposite to the first direction D1 from the first pinning site P1 after or during conversion. But, by adjusting the intensity and application time of the second current I2, the transverse wall W1 of FIG. 6D may be changed to the vortex wall W1' while still being positioned at the first pinning site P1.

Because the energy of the vortex wall W1' is relatively stable in a place where the width of the magnetic layer 100 is relatively wide, the vortex wall W1' may spontaneously move to the second pinning site P2.

Figure 6F:
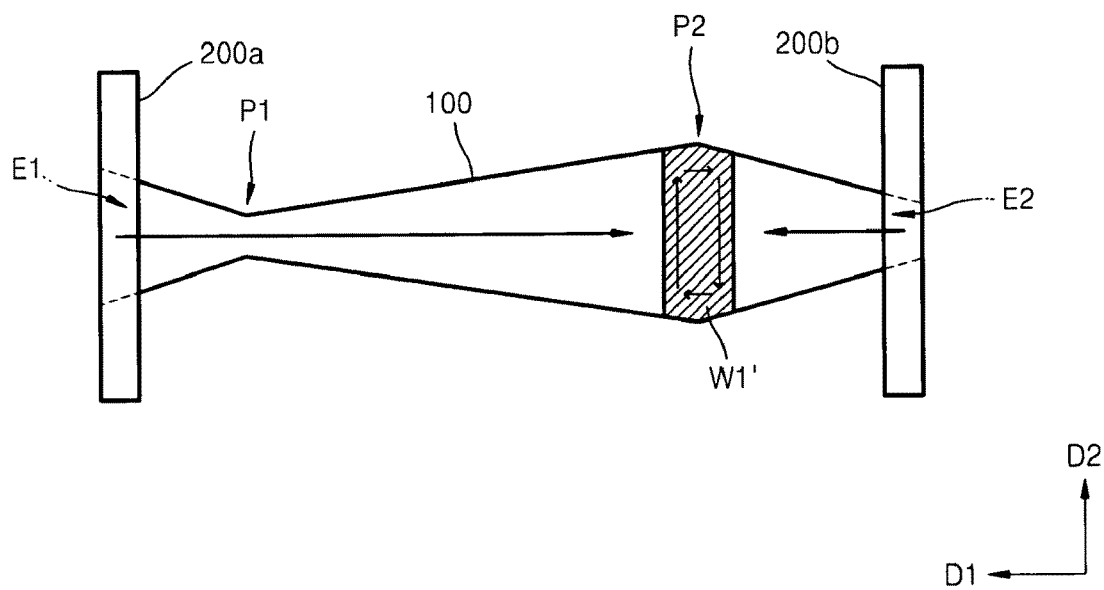

FIG. 6F illustrates a state in which the vortex wall W1' is pinned at the second pinning site P2. The magnetic layer 100 of FIG. 6F may correspond to the magnetic layer 100 of FIG. 5C.

Figure 6G:
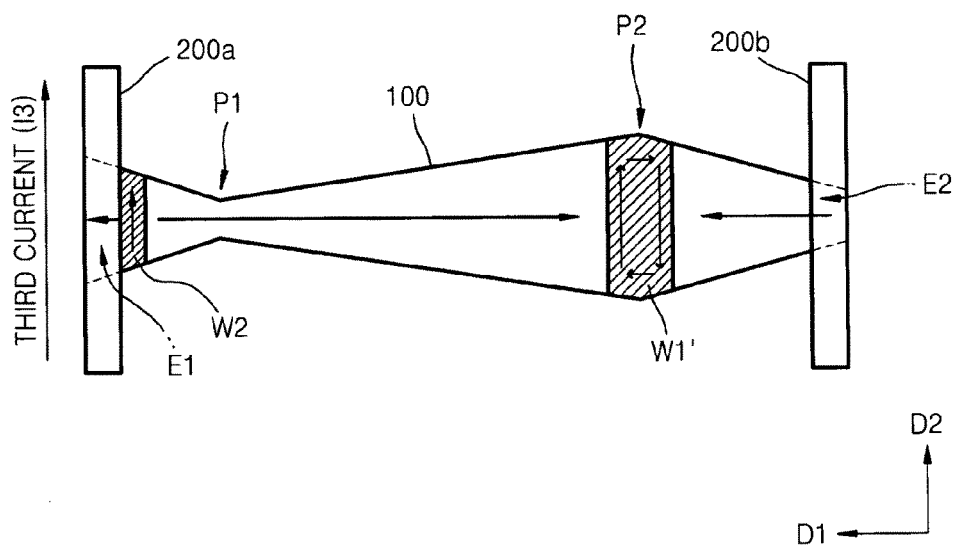

Referring to FIG. 6G, a third current I3 may be applied to the other end of the first conductive layer 200a. The third current I3 may have a direction opposite to the first current I1 of FIG. 6B. The intensities of the first current I1 and the third current I3 may be the same or substantially the same. In this example, the first end E1 of the magnetic layer 100 may be magnetized in a first direction D1 by the third current I3 according to the right hand screw rule and a transverse wall W2 may be generated between the first end E1 of the magnetic layer 100 and the other region thereof.

Because the energy of the transverse wall W2 is relatively stable in a place where the width of the magnetic layer 100 is relatively narrow, the transverse wall W2 may spontaneously move to the first pinning site P1.

Figure 6H:
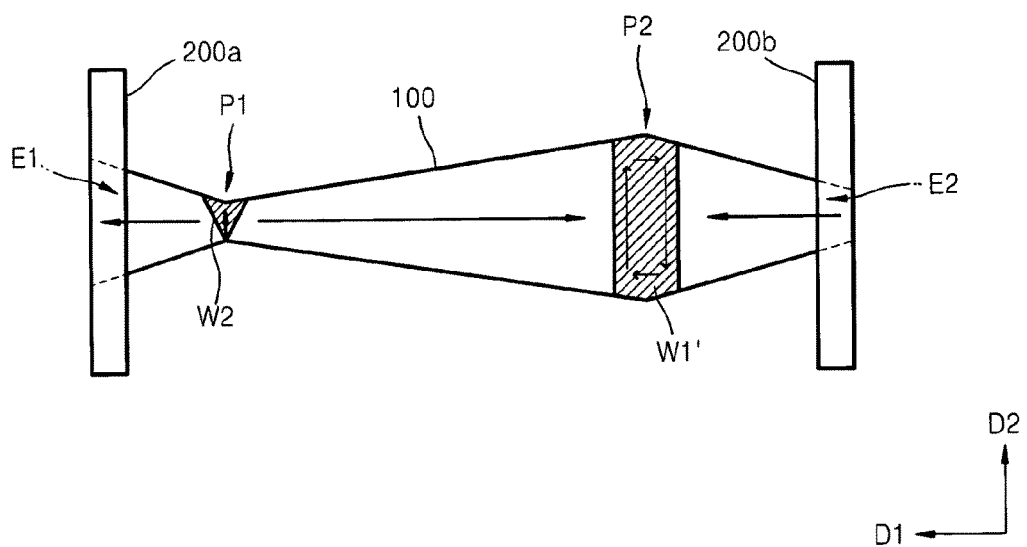

FIG. 6H illustrates a state in which the transverse wall W2 is moved to the first pinning site P1 and pinned at the first pinning site P1. The magnetic layer 100 of FIG. 6H may correspond to the magnetic layer 100 of FIG. 5D.

Figure 6I:
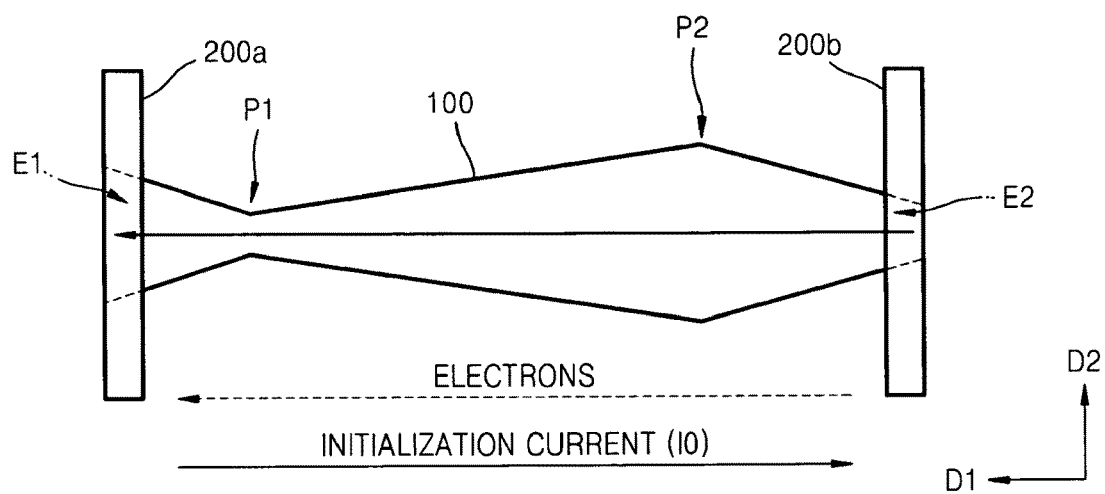

Referring to FIG. 6I, an initialization current I0 may be applied to the magnetic layer 100 so that the magnetic layer 100 may be magnetized in the first direction D1. The initialization current I0 may be applied in a direction opposite to the first direction D1 to remove the magnetic domain walls (e.g., the vortex wall W1' and the transverse wall W2) within the magnetic layer 100. The magnetic layer 100 of FIG. 6I may be the same or substantially the same as the magnetic layer 100 of FIG. 6A.

Methods of operating the information storage device according to example embodiments as shown and described with reference to FIGS. 6A through 6I may be modified in various shapes. For example, the directions of the first, second, and third currents I1, I2, and I3 and the initialization current I0 of FIGS. 6B, 6D, 6G, and 6I may be changed to a direction opposite the directions shown in FIGS. 6B, 6D, 6G, and 6I, and the magnetization directions of the transverse type first and second magnetic domain walls W1 and W2 and the vortex type first magnetic domain wall W1' may be changed. In addition, when a current in a direction opposite to the first direction D1 is applied to the magnetic layer 100 of FIG. 6F, the magnetic layer 100 of FIG. 6F may be changed in the same or substantially the same manner as the magnetic layer 100 of FIG. 6C. Additionally, after operations of FIGS. 6A through 6C are performed, the initialization current I0 may be applied or after operations of FIGS. 6A through 6F, the initialization current I0 may be applied.

Figure 7:
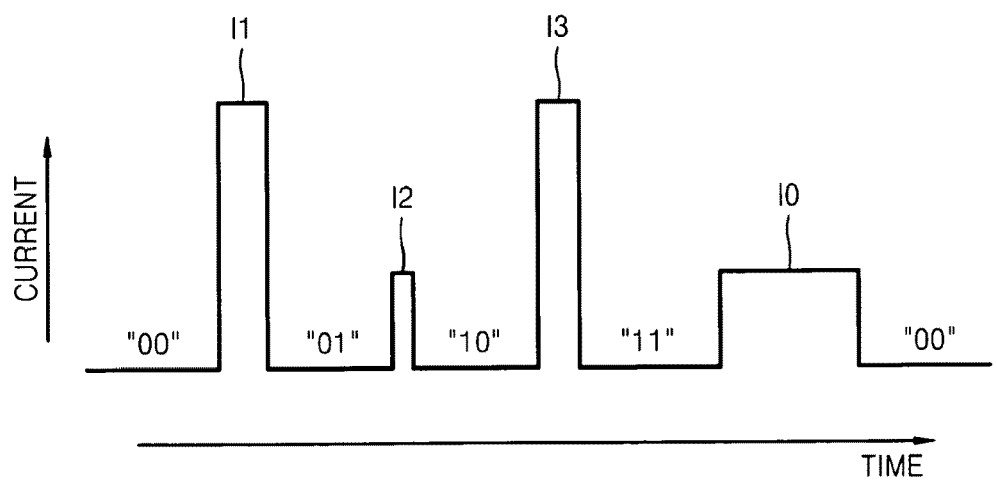
FIG. 7 is a graph showing first, second, and third currents I1, I2, and I3 and an initialization current I0 shown in FIGS. 6B, 6D, 6G, and 6I, respectively.

FIG. 7 is a graph showing first, second, and third currents I1, I2, and I3 and an initialization current I0 shown in FIGS. 6B, 6D, 6G, and 6I, respectively. Referring to FIGS. 6A-6I and 7, the application of the first current I1 may result in generation of a transverse wall W1. The generation of the transverse wall W1 may correspond to storing bit values '01' within the magnetic layer 100. The application of the second current I2 may convert the transverse wall W1 into a vortex wall W1', which may correspond to storing bit values '10' in the magnetic layer 100. The third current I3 may be applied to generate a second transverse wall W2, which may correspond to storing bit values '11' in the magnetic layer 100. When no domain walls are present in the magnetic layer 100, the magnetic layer 100 may store bit values '00'.

Referring to FIG. 7, intensities of the first and third currents I1 and I3 may be greater than the intensity of the second current I2, and applying times of the first and third currents I1 and I3 may be slightly longer than the applying time of the second current I2. This is because an energy needed to magnetize the first end E1 of the magnetic layer 100 of FIG. 6B in the second direction D2 may be larger than an energy needed to change the transverse wall W1 of FIG. 6D. The intensity of the initialization current I0 may be the same as, substantially the same as, or greater than the intensity of the second current I2, and the application time of the initialization current I0 may be longer than the application time of the second current I2. The intensities and the application times of the first, second, and third currents I1, I2, and I3 and the initialization current I0 may be changed according to a material used in forming the magnetic layer 100 and/or the shape and size of the magnetic layer 100.

Example embodiments described with reference to FIGS. 6A through 6I relate to methods of writing and erasing information. An operation of reading written information may be performed by applying a given read current between the first end E1 and a second end E2 of the magnetic layer 100 of FIG. 1. For example, after the resistance of the magnetic layer 100 is measured by applying the read current between the first and second conductive layers 200a and 200b, the measured resistance and a reference resistance may be compared to determine whether information is written on the magnetic layer 100. The read current may have an intensity smaller than the intensities of currents used to write and/or erase information (e.g., the intensities of the first, second, and third currents I1, I2, and I3, and the initialization current I0).

While example embodiments have been particularly shown and described with reference to preferred embodiments thereof, it will be understood by one of ordinary skill in the art that various changes in form and details may be made therein without departing from the spirit and scope of the invention as defined by the appended claims. For example, it will be understood by one of ordinary skill in the art that two or more pinning sites may exist between the first end E1 and the second end E2 of the magnetic layer 100 of FIG. 1, and thus, an information storage device in which multi-bit (e.g., 2 or more bit information) is written in one memory cell may be implemented. In addition, the shapes of the magnetic layer 100 of FIG. 1 and the first and second conductive layers 200a and 200b may be modified in various shapes. Therefore, the scope of the present invention is defined not by the detailed description, but by the appended claims, and all differences within the scope will be construed as being included in the present invention.

What is claimed is:

1. An information storage device comprising:
   a magnetic layer configured to store information, the magnetic layer including at least first and second pinning regions, each of the first and second pinning regions being configured to pin a magnetic domain wall, the widths of the magnetic layer at the first and second pinning regions being different;
   a first conductive layer contacting a first end of the magnetic layer; and
   a second conductive layer contacting a second end of the magnetic layer.

2. The information storage device of claim 1, wherein the first end of the magnetic layer, the first pinning region, the second pinning region, and the second end of the magnetic layer are arranged sequentially in a lengthwise direction, the width of the magnetic layer being tapered from the first end to the first pinning region, the width of the magnetic layer increasing from the first pinning region to the second pinning region, and the width of the magnetic layer being tapered from the second pinning region to the second end of the magnetic layer.

3. The information storage device of claim 1, wherein the magnetic layer has horizontal magnetic anisotropy.

4. The information storage device of claim 1, wherein types of magnetic domain walls pinned at the first and second pinning regions are different, and a resistance state of the magnetic layer depends on whether magnetic domain walls exist in the first and second pinning regions.

5. The information storage device of claim 1, wherein at least one of the first and second conductive layers crosses the magnetic layer.

6. The information storage device of claim 5, wherein at least one of the first and second conductive layers is arranged perpendicular to the magnetic layer.

7. The information storage device of claim 1, wherein each of the first end of the magnetic layer, the first pinning region, the second pinning region, and the second end of the magnetic layer are arranged in a straight line.

8. The information storage device of claim 1, wherein the first end of the magnetic layer, the first pinning region, the second pinning region, and the second end of the magnetic layer are arranged such that a line passing through a center of each of the first end, the first pinning region, the second pinning region, and the second end is curved.

9. A method of operating the information storage device of claim 1, the method comprising:
   applying a current to at least one of the first conductive layer, the second conductive layer and the magnetic layer.

10. The method of claim 9, wherein the current is one of a write current, a read current, and an erase current.

11. The method of claim 9, wherein the first end of the magnetic layer, the first pinning region, the second pinning region, and the second end of the magnetic layer are arranged sequentially, the width of the magnetic layer being tapered from the first end to the first pinning region, the width of the magnetic layer increasing from the first pinning region to the second pinning region, and the width of the magnetic layer being tapered from the second pinning region to the second end of the magnetic layer.

12. The method of claim 9, wherein the applying further includes,
   applying a first current to the first conductive layer so that the first end of the magnetic layer is magnetized in a direction opposite to a first magnetization direction of the magnetic layer, the magnetization direction of the magnetic layer being parallel to the lengthwise direction of the magnetic layer, wherein
   a first magnetic domain wall of a first type generated between the first end and the first pinning region of the magnetic layer is moved to the first pinning region and is pinned at the first pinning region.

13. The method of claim 12, wherein the applying further includes,
   applying an initialization current to the magnetic layer before the applying of the first current to the first con ductive layer, the initialization current being applied to magnetize the magnetic layer in the first magnetization direction.

14. The method of claim 12, wherein the applying further includes, applying an initialization current to the magnetic layer after the applying of the first current to the first conductive layer, the initialization current being applied to magnetize the magnetic layer in the first magnetization direction.

15. The method of claim 12, wherein the applying further includes, applying a second current to the magnetic layer after the applying of the first current to the first conductive layer, the applying of the second current changing the first magnetic domain wall to a second type and moving the first magnetic domain wall to the second pinning region.

16. The method of claim 15, further comprising:

applying an initialization current to the magnetic layer after the applying of the second current to the magnetic layer, the initialization current being applied so that the magnetic layer is magnetized in the first magnetization direction.

17. The method of claim 15, wherein an intensity of the second current is smaller than an intensity of the first current.

18. The method of claim 15, wherein the applying further includes, applying a third current to the first conductive layer after the applying of the second current to the magnetic layer, the third current being applied to magnetize the first end of the magnetic layer in the first magnetization direction, wherein a second magnetic domain wall of a first type generated between the first end of the magnetic layer and the first pinning region moves to the first pinning region and is pinned at the first pinning region.

19. The method of claim 18, wherein the applying further includes, applying an initialization current to the magnetic layer after the applying of the third current to the first conductive layer, the initialization current being to magnetize the magnetic layer in the first magnetization direction.

20. The method of claim 15, wherein the applying further includes, applying a further current to the magnetic layer after the applying of the second current to the magnetic layer, the further current being applied so that the first magnetic domain wall positioned at the second pinning region changes from the second type to the first type and moves to the first pinning region.

* * * * *